(12) United States Patent
Katoh et al.

(10) Patent No.: US 7,743,998 B2
(45) Date of Patent: Jun. 29, 2010

(54) STAGE DEVICE

(75) Inventors: Taturoh Katoh, Saitama (JP); Kazuharu Uchimi, Tokyo (JP); Hiroshi Murayama, Kanagawa (JP); Hidehiko Mashimo, Kanagawa (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 1101 days.

(21) Appl. No.: 10/576,922

(22) PCT Filed: Oct. 15, 2004

(86) PCT No.: PCT/JP2004/015276

§ 371 (c)(1),
(2), (4) Date: Apr. 24, 2006

(87) PCT Pub. No.: WO2005/040945

PCT Pub. Date: May 6, 2005

(65) Prior Publication Data
US 2007/0158401 A1    Jul. 12, 2007

(30) Foreign Application Priority Data
Oct. 23, 2003   (JP) .............................. 2003-363581

(51) Int. Cl.
*G06K 7/00*   (2006.01)

(52) U.S. Cl. ..................................... 235/486
(58) Field of Classification Search .................. 235/486
See application file for complete search history.

(56) References Cited

U.S. PATENT DOCUMENTS

| | | | | |
|---|---|---|---|---|
| 3,857,075 A | * | 12/1974 | Sawyer | 318/38 |
| 5,015,936 A | * | 5/1991 | Inoue | 318/687 |
| 5,539,532 A | * | 7/1996 | Watanabe | 358/443 |

FOREIGN PATENT DOCUMENTS

| | | |
|---|---|---|
| JP | 61-117034 A | 6/1986 |
| JP | 2000-29530 | 1/2000 |
| JP | 2000-65970 A | 3/2000 |
| JP | 2000-155186 | 6/2000 |
| JP | 2000-356693 | 12/2000 |
| JP | 2001-22448 A | 1/2001 |
| JP | 2003-25178 | 1/2003 |
| JP | 2004-9176 | 1/2004 |

* cited by examiner

*Primary Examiner*—Jamara A Franklin
(74) *Attorney, Agent, or Firm*—Arent Fox LLP

(57) ABSTRACT

A stage device has guide members (2, 3) for guiding each of two moving bodies (4, 5) in one axis direction on a level block (1) and has a beam (6) laid across the two moving bodies (4, 5) so as to be perpendicular to the guide members (2, 3) and moving together with the moving bodies (4, 5). The two moving bodies (4, 5) are individually moved to rotate the beam (6) relative to a yaw rotation axis perpendicular to the one axis direction.

6 Claims, 6 Drawing Sheets

STAGE DEVICE

CROSS-REFERENCE TO RELATED APPLICATION

This application is a National Stage entry of International Application Number PCT/JP2004/015276, filed Oct. 15, 2004. The disclosure of the prior application is hereby incorporated herein in its entirety by reference.

TECHNICAL FIELD

This invention relates to a stage device. This invention is suitable particularly for a stage device including two linear motors that respectively cause two moving bodies to be movable in one axis direction, a guide member for guiding at least one of the two moving bodies, and a beam laid between the two moving bodies so as to be moved along with the two moving bodies.

BACKGROUND ART

One example of a stage device of this type will be described with reference to FIGS. 1(a) and 1(b). In FIGS. 1(a) and 1(b), two guide rails 2 and 3 are disposed on a surface plate 1 so as to be parallel to each other with a predetermined distance therebetween. The guide rails 2 and 3 each extend in a Y-axis direction shown in FIG. 1(a). Moving bodies 4 and 5 are mounted on the guide rails 2 and 3, respectively. Herein, the guide rail 2 and the moving body 4 will be described. As shown in FIG. 1(b), the moving body 4 is provided with static pressure bearing pads 12. The static pressure bearing pads 12 are interposed between the guide rail 2 and the moving body 4. The moving body 4 is also provided with a static pressure bearing pad 13. The static pressure bearing pad 13 is interposed between the surface plate 1 and the moving body 4. By this, the moving body 4 is movable along the guide rail 2 in the Y-axis direction.

Likewise, the moving body 5 is also provided with static pressure bearing pads 12 and 13. The moving body 5 is movable along the guide rail 3 in the Y-axis direction.

A beam 6 is laid between the moving body 4 and the moving body 5. The beam 6 extends in an X-axis direction shown in FIG. 1(a). The beam 6 has one end rigidly fixed to the moving body 4 and the other end joined to the moving body 5 through a plate spring structure 8. The fixation between the moving body 4 and the one end of the beam 6 is carried out, for example, by the use of screws. By this, the beam 6 is movable in the Y-axis direction along with the moving bodies 4 and 5.

A moving body (movable portion) 14 is mounted on the beam 6. The moving body 14 is movable in the X-axis direction using the beam 6 as a guide. Static pressure bearing pads 14a to 14c are disposed between the surface plate 1 and the moving body 14. The static pressure bearing pads 14a to 14c are attached to the moving body 14. By this, the moving body 14 is guided by the static pressure bearing pads 14a to 14c in a Z-axis direction with respect to the surface plate 1 and movable in the X-axis direction.

In FIG. 1(a), the moving body 4 is shown with a portion thereof removed, while the moving body 14 is shown with an upper portion thereof removed.

A static pressure bearing pad 15 is attached to a lower surface of the beam 6 at its center portion. The static pressure bearing pad 15 is interposed between the surface plate 1 and the beam 6. By this, the beam 6 is supported by the static pressure bearing pad 15. That is, the static pressure bearing pad 15 moves along with the beam 6 over the entire strokes in the X-axis direction and the Y-axis direction without impeding the movement of the moving body 14 while supporting the self-weight of the beam 6 and thus supports the beam 6 so as not to apply excessive loads to the joining portion between the beam 6 and the moving body 5, and so on. Such a stage device is disclosed, for example, in Japanese Unexamined Patent Application Publication (JP-A) No. 2000-356693 (hereinafter referred to as Document 1).

As drive sources of the moving bodies 4, 5, and 14, linear motors are normally used. For example, the linear motors are formed between the guide rail 2 and the beam 6 and between the guide rail 3 and the beam 6, respectively, so that the moving bodies 4 and 5 serve as movable portions. Further, the linear motor is formed between the beam 6 and the moving body 14 so that the moving body 14 serves as a movable portion.

In the case of using a moving coil type linear motor, description about the linear motor, for example, formed between the guide rail 2 and the beam 6 will be as follows. A plurality of permanent magnets are arranged at regular intervals along the guide rail 2. A plurality of permanent magnets are arranged with a gap defined with respect to those plurality of permanent magnets so that different magnetic poles face each other. Then, a movable coil joined to the moving body 4 is disposed in the gap so as to be movable along with the moving body 4.

In such a stage device, in addition to the foregoing structure, each linear motor is provided with a position sensor in the combination of a linear scale and a linear sensor for position control of the moving body 4, 5, or 14. Further, synchronous control is implemented with respect to the linear motors for the moving bodies 4 and 5. Such a stage device is disclosed, for example, in Japanese Unexamined Patent Application Publication (JP-A) No. 2000-155186 (hereinafter referred to as Document 2).

In such a stage device, a table for placing thereon a member to be processed or the like is installed on the moving body 14 and drive control is implemented for accurately positioning the member to be processed.

On the other hand, in such a stage device, it is necessary that the beam 6 be orthogonal to the guide rails 2 and 3 for accurately positioning the member to be processed. This is because positioning specification of the member to be processed is carried out by the use of X-coordinate and Y-coordinate on the surface plate 1. The stage device so far uses, as a criterion, an orthogonality based on machine accuracy at the time when the beam 6 is located at a certain reference position (reference coordinates), for example, at an origin position set close to an end portion of one of the guide rails 2 and 3. Thereafter, when the moving bodies 4 and 5 are subjected to position offset, the moving bodies 4 and 5 are individually controlled in position so as to maintain the foregoing orthogonality based on the machine accuracy within a predetermined range.

However, in the stage device of this type, when continuous operation is carried out, the respective members, particularly the beam 6 and its peripheral members, may be subjected to deformation due to heat generation of the linear motors. As a result, the orthogonality of the beam 6 with respect to the guide rails 2 and 3 may deviate from the foregoing predetermined range. That is, in the stage device so far, when the continuous operation is carried out, the respective members in the stage device are subjected to temperature rise due to the heat generation. There has been a problem that when the orthogonality of the beam 6 changes thereby, the orthogonality of the beam 6 with respect to the guide rails 2 and 3 cannot be maintained within the predetermined range and thus the accurate positioning cannot be achieved.

DISCLOSURE OF THE INVENTION

Problem to be Solved by the Invention

Therefore, it is an object of this invention to provide a stage device having a function that can maintain an orthogonality of a beam with respect to a guide rail within a predetermined set range even when continuous operation is carried out.

Means for Solving the Problem

A stage device according to this invention comprises a surface plate, two linear motors for respectively moving two moving bodies in one axis direction on the surface plate, a guide member for guiding at least one of the two moving bodies in the one axis direction, and a beam laid between the two moving bodies so as to be orthogonal to the guide member and to be moved along with the two moving bodies.

According to an aspect of this invention, the stage device further comprises two position sensors for respectively detecting positions of the two moving bodies, two origin sensors for respectively defining origin positions of the two moving bodies, and a controller for, responsive to detection signals from the two position sensors and the two origin sensors, controlling the two linear motors to thereby perform a position control of the two moving bodies. The controller has a yaw axis rotation control function of individually controlling the two linear motors to thereby rotate the beam about a yaw rotation axis perpendicular to the one axis direction. Based on the yaw axis rotation control function, the controller performs, at the time of starting the stage device, a control of maintaining an orthogonality of the beam with respect to the guide member within a predetermined range even when the orthogonality of the beam with respect to the guide member changes.

In a stage device according to a preferred aspect of this invention, the controller comprises a storage unit storing therein a yaw axis rotation control program for performing the yaw axis rotation control function. The storage unit stores initial value data of the yaw axis rotation control program as a target value. The target value is determined by the controller based on the orthogonality of the beam measured while the stage device is stopped, the target value being a correction value $\Delta y1$ necessary for causing the orthogonality of the beam to fall within the predetermined range.

The yaw axis rotation control program is for executing a step of driving, at the time of starting the stage device, the two moving bodies to positions detected by the two origin sensors in the state where the orthogonality of the beam is changed and calculating a difference $\Delta y3$ between two coordinate data obtained by the two position sensors at that time instant, and a step of using the correction value $\Delta y1$ and the difference $\Delta y3$ and rotating the beam about the yaw rotation axis by $(\Delta y1 - \Delta y3)$.

The controller calculates a difference $\Delta y0$ between two coordinate data obtained by the two position sensors when the moving bodies are moved to positions detected by the two origin sensors in the state where the stage device is placed as it is and stores the calculated difference $\Delta y0$ into the storage unit. The controller further determines the correction value $\Delta y1$ based on the calculated difference $\Delta y0$.

It is preferable that a stage device according to this invention comprise two guide members extending in parallel to each other in the one axis direction for respectively guiding the two moving bodies in the one axis direction, wherein the beam have one end fixed to one of the two moving bodies and the other end joined to the other of the two moving bodies through a plate spring structure.

BEST MODE FOR CARRYING OUT THE INVENTION

Referring to FIGS. 2(a) and 2(b) to FIG. 8, description will be made about a preferred embodiment of a stage device according to this invention.

Figure 1A:
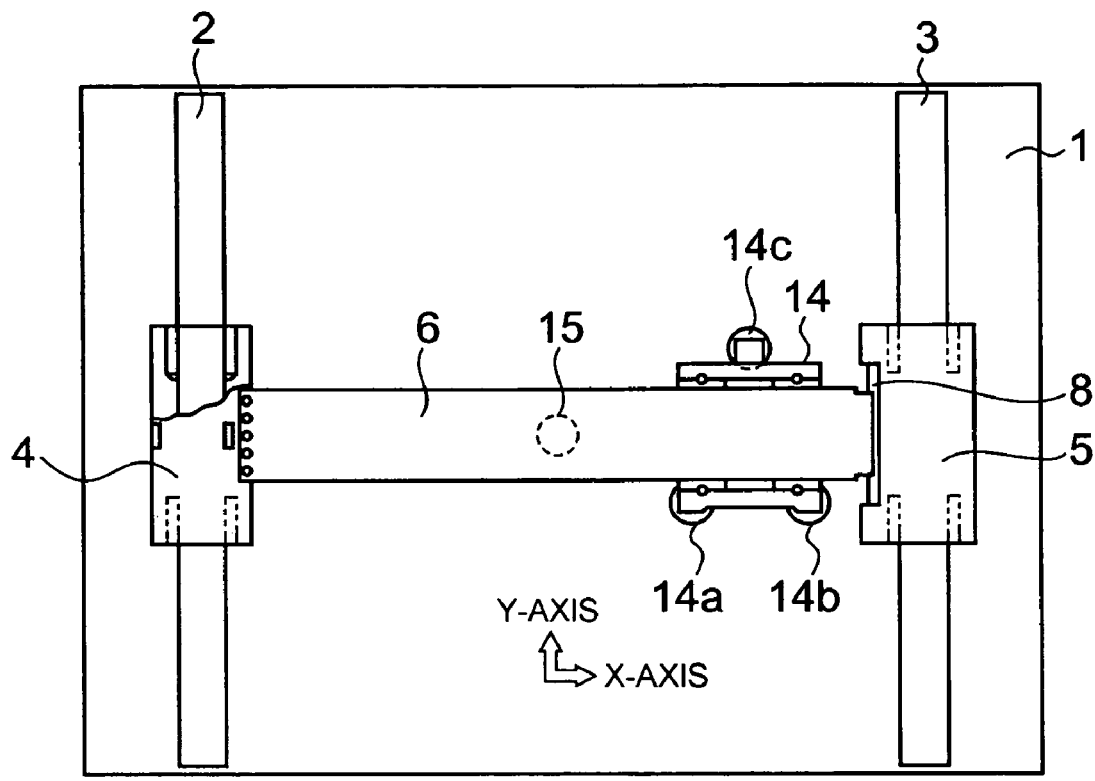
FIG. 1(a) is a plan view for explaining one example of a conventional stage device.
Figure 1B:
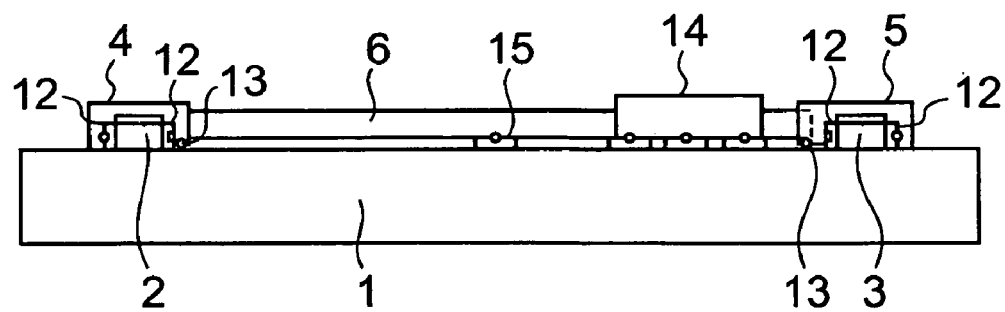
FIG. 1(b) is a front view for explaining one example of the conventional stage device.

The gist of this invention resides in that even when a stage device is started again after continuous operation thereof, an orthogonality of a beam with respect to a guide rail can be maintained within a predetermined set range. Therefore, this invention is applicable to a stage device comprising a surface plate, two linear motors that respectively cause two moving bodies to be movable in one axis direction, a guide member for guiding at least one of the two moving bodies, and a beam laid between the two moving bodies so as to be moved along with the two moving bodies. Naturally, this invention is also applicable to a stage device having a structure where two moving bodies are respectively guided by two guide members extending in parallel to each other in one axis direction. That is, this invention is also applicable to the stage device disclosed in Document 1 and described with reference to FIGS. 1(a) and 1(b) or the stage device disclosed in Document 2. Note that deformation of a beam that raises an issue about the orthogonality in this invention is a deformation amount in the plane parallel to an upper surface of a surface plate.

Therefore, description will be made hereinbelow based on the following point as a prerequisite.

Figure 2A:
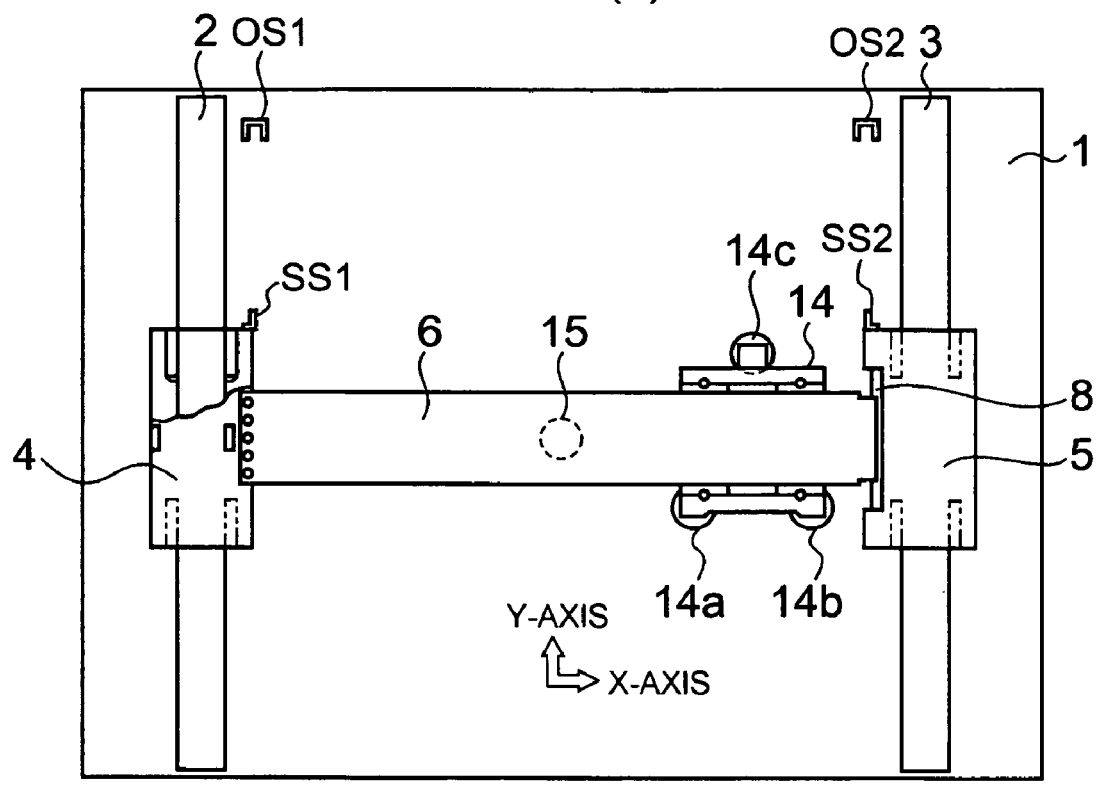
FIG. 2(a) is a plan view for explaining a stage device according to this invention.
Figure 2B:
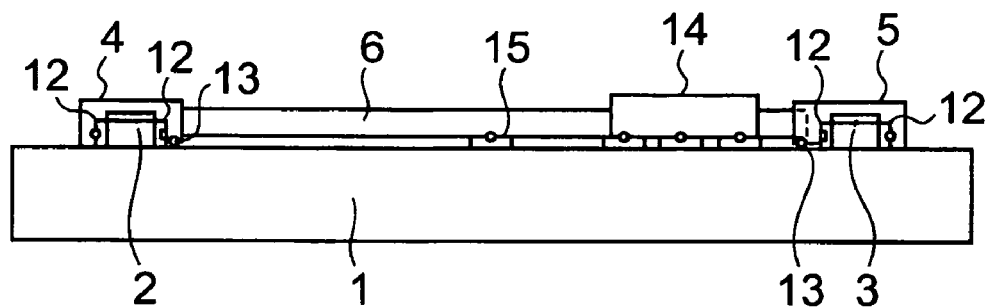
FIG. 2(b) is a front view for explaining the stage device according to this invention.

FIGS. 2(a) and 2(b) show the stage device according to the embodiment of this invention. This stage device has the same structure as that of the stage device described with reference to FIGS. 1(a) and 1(b) except a controller and origin sensors which will be described later. Accordingly, the same reference numerals are assigned to those components that are the same as the components shown in FIGS. 1(a) and 1(b) and the structure of the stage device will be briefly described.

In FIGS. 2(a) and 2(b), two guide rails 2 and 3 are disposed on a surface plate 1 so as to be parallel to each other with a predetermined distance therebetween. The guide rails 2 and 3 each extend in the Y-axis direction. Moving bodies 4 and 5 are mounted on the guide rails 2 and 3, respectively.

The guide rail 2 and the moving body 4 will be described. The moving body 4 is provided with static pressure bearing pads 12. The static pressure bearing pads 12 are interposed between the guide rail 2 and the moving body 4. The moving body 4 is also provided with a static pressure bearing pad 13. The static pressure bearing pad 13 is interposed between the surface plate 1 and the moving body 4. By this, the moving body 4 is movable along the guide rail 2 in the Y-axis direction.

Likewise, the moving body 5 is also provided with static pressure bearing pads 12 and 13. The moving body 5 is movable along the guide rail 3 in the Y-axis direction.

A beam 6 is laid between the moving body 4 and the moving body 5. The beam 6 extends in the X-axis direction. The beam 6 has one end rigidly fixed to the moving body 4 and the other end joined to the moving body 5 through a plate spring structure 8. The fixation between the moving body 4 and the one end of the beam 6 is carried out, for example, by the use of screws. By this, the beam 6 is movable in the Y-axis direction along with the moving bodies 4 and 5.

A moving body (movable portion) 14 is mounted on the beam 6. The moving body 14 is movable in the X-axis direction using the beam 6 as a guide. Static pressure bearing pads 14a to 14c are disposed between the surface plate 1 and the moving body 14. The static pressure bearing pads 14a to 14c are attached to the moving body 14. By this, the moving body 14 is movable in the X-axis direction.

A static pressure bearing pad 15 is attached to a lower surface of the beam 6 at its center portion. The static pressure bearing pad 15 is interposed between the surface plate 1 and the beam 6. By this, the beam 6 is supported by the static pressure bearing pad 15.

Linear motors are used as drive sources of the moving bodies 4, 5, and 14. For example, the linear motors are formed between the guide rail 2 and the beam 6 and between the guide rail 3 and the beam 6, respectively, so that the moving bodies 4 and 5 serve as movable portions. Further, the linear motor is formed between the beam 6 and the moving body 14 so that the moving body 14 serves as a movable portion.

Each linear motor is provided with a position sensor in the combination of a linear scale and a linear sensor for position control of the moving body 4, 5, or 14. The linear motors can be individually controlled by a later-described controller.

In this stage device, a table for placing thereon a member to be processed or the like is installed on the moving body 14 and drive control is implemented for accurately positioning the member to be processed.

Figure 3:
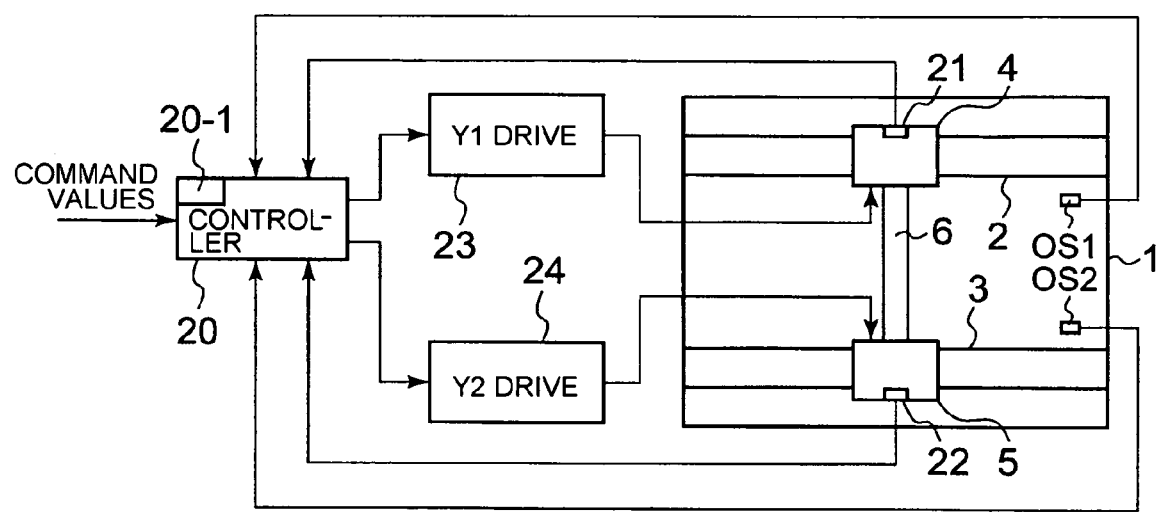
FIG. 3 is a diagram for explaining one example of a control system of the stage device according to this invention.

As shown in FIG. 3, position detection signals indicative of position detection values are fed back to a controller 20 from a position sensor 21 on the side of the moving body 4 and a position sensor 22 on the side of the moving body 5. The position sensors 21 and 22 are each, for example, in the combination of a linear scale and a linear sensor as described above. The controller 20 is connected to a Y1 drive 23 for driving the linear motor on the side of the moving body 4 and a Y2 drive 24 for driving the linear motor on the side of the moving body 5. The controller 20 uses the position detection values from the position sensors 21 and 22 as feedback values and, based on deviations between them and position command values, controls the Y1 drive 23 and the Y2 drive 24, thereby controlling the positions of the moving bodies 4 and 5.

Particularly, the fact that the moving bodies 4 and 5 shown in FIGS. 2(*a*) and 2(*b*) can be individually controlled in position means that the controller 20 can perform yaw axis rotation control of the beam 6. The yaw axis rotation control is a control for allowing the beam 6 to rotate about its center axis by a very small angle. Further, the center axis of the beam 6 represents a center axis in the Z-axis direction perpendicular to the X-axis or an upper surface of the surface plate 1. Hereinafter, this center axis will be referred to as a yaw center axis and the rotation about this yaw center axis will be referred to as yaw axis rotation. It is assumed that the distance between the two linear scales in the two linear motors is constant over the entire length.

Note that FIG. 3 only shows the basic structure of the control system of the stage device according to this invention for simplifying the description. The control system of the stage device according to this invention is not limited to that of FIG. 3. Further, although not shown in FIG. 3, a position detection signal from a position sensor (not shown) on the side of the moving body 14 is also fed back to the controller 20. Based on a deviation between a command value for the moving body 14 and a position detection value from the position sensor on the side of the moving body 14, the controller 20 controls a drive (not shown) for the moving body 14 to thereby control the position of the moving body 14.

Hereinbelow, the linear motor on the side of the moving body 4 will be referred to as a Y1 linear motor and the linear scale provided there as a Y1 scale, while, the linear motor on the side of the moving body 5 will be referred to as a Y2 linear motor and the linear scale provided there as a Y2 scale.

In FIGS. 2(*a*) and 2(*b*), origin sensors OS1 and OS2 for setting and detecting origin positions of the moving bodies 4 and 5 are provided on the surface plate 1 close to one-end sides of the guide rails 2 and 3, respectively. Detection signals from the origin sensors OS1 and OS2 are also input into the controller 20 and the beam 6 (the moving bodies 4 and 5) is stopped at detection positions by the origin sensors OS1 and OS2. The origin sensors OS1 and OS2 detect that portions of the moving bodies 4 and 5 have reached there, respectively. As will be described later, use is made of sensors of optical type, magnetic type, or the like. As will be made clear later, the magnetic sensor can achieve higher detection accuracy as compared with the optical sensor. In the case of using the optical sensors, the moving bodies 4 and 5 are respectively provided with shielding members SS1 and SS2 for shielding optical paths in the origin sensors OS1 and OS2. In the case of the magnetic sensors, the layout relationship may be considered the same except that members to be detected are magnetically detected. That is, the members to be detected are provided as SS1 and SS2.

Figure 4:
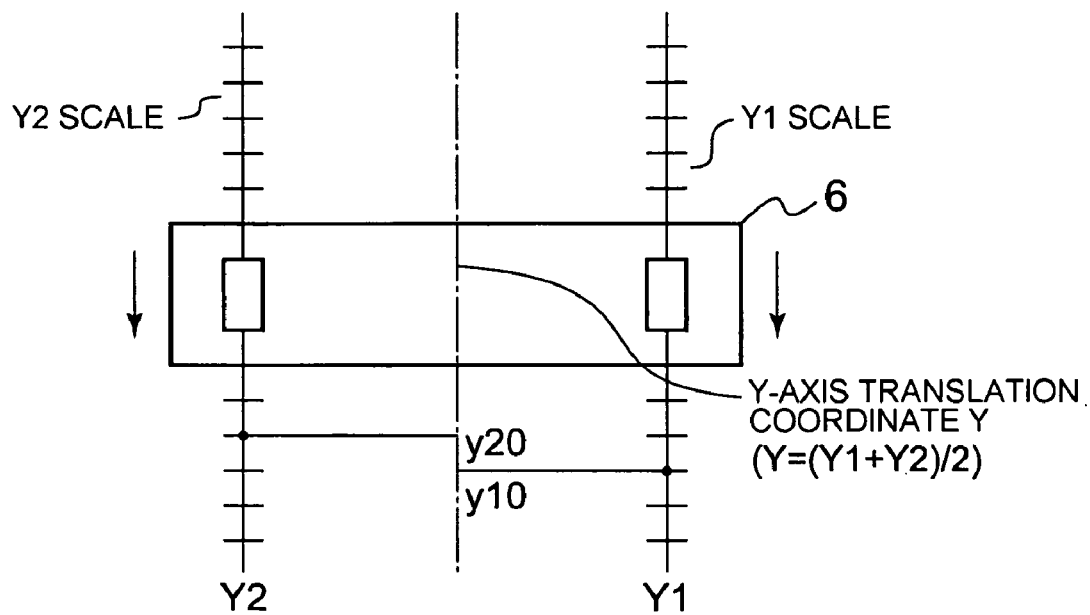
FIG. 4 is a diagram for explaining an operation for adjusting an orthogonality between a beam and guide rails, which is carried out in this invention.
Figure 5:
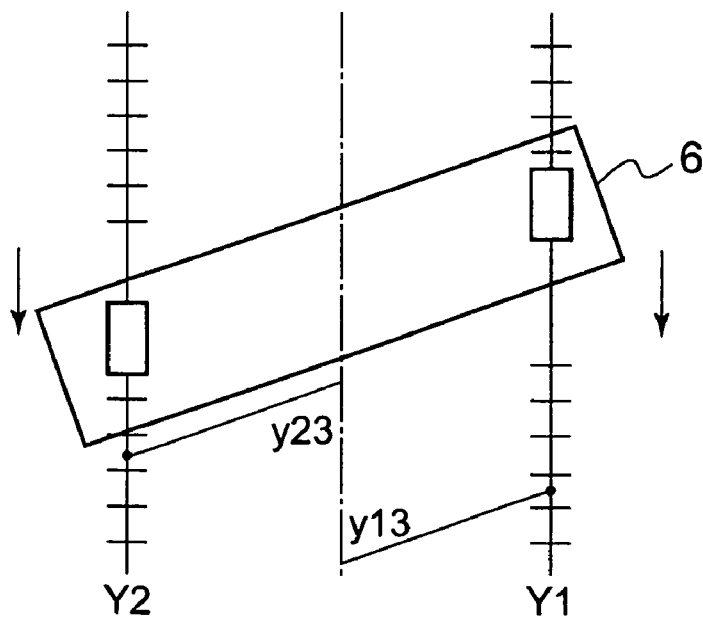
FIG. 5 is a diagram for explaining an operation that is carried out when performing a mechanical reset after continuous operation of the stage device in this invention.
Figure 6:
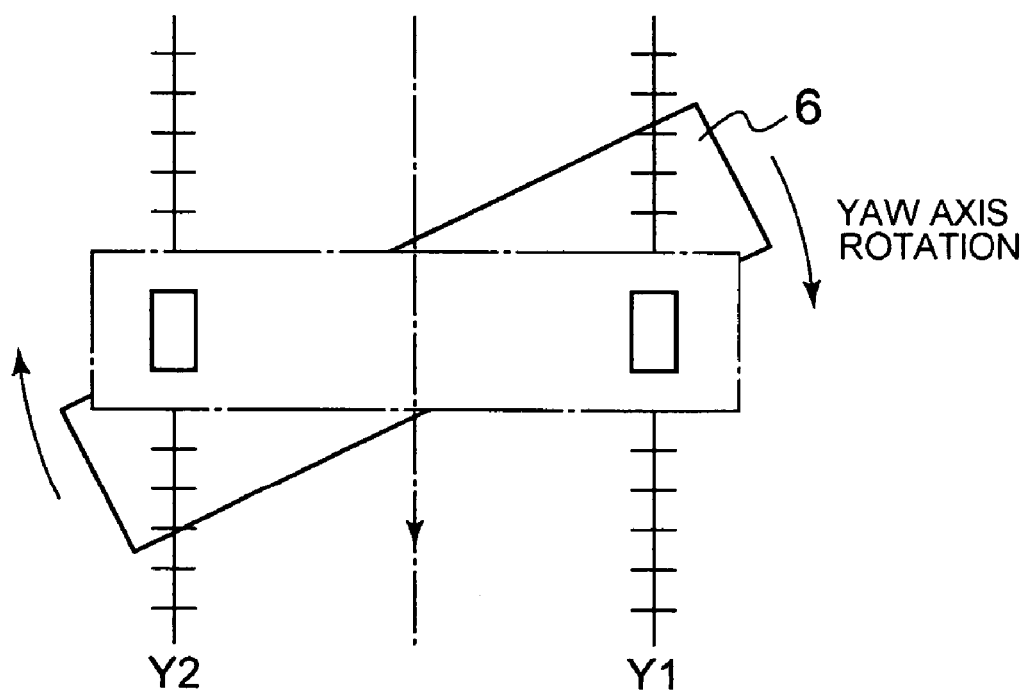
FIG. 6 is a diagram for explaining an operation that is carried out following the operation of FIG. 5 in this invention.

Referring to FIGS. 4 to 6, description will be made about control operation for maintaining the orthogonality, which is the gist of this invention as described before.

FIG. 4 is a diagram for explaining an operation for adjusting the orthogonality, which is carried out before shipping the stage device applied with this invention. That is, before shipping the stage device, the operation is carried out for obtaining data in an initial state. Naturally, this operation is carried out by the use of the controller 20 provided in the stage device.

In FIG. 4, the position of the moving body 4 on the Y1 linear motor side is detected by the Y1 scale and the position of the moving body 5 on the Y2 linear motor side is detected by the Y2 scale. In this case, with respect to the beam 6, the position of its yaw center axis is given by a Y-axis translation coordinate. The value of the Y-axis translation coordinate is a mean value (y1+y2)/2 of coordinate data y1 by the Y1 scale and coordinate data y2 by the Y2 scale.

(1) Data Acquisition in the State where Assembly Accuracy is ensured

This is implemented in the state where the orthogonality is adequate, i.e. in the state where the beam 6 is mechanically made orthogonal to the guide rails 2 and 3 by the use of a prototype square.

1-a. Preparation

The Y1 linear motor and the Y2 linear motor are started with accuracy in the state where the stage device is as it is (the state before the beam 6 is mechanically made orthogonal to the guide rails 2 and 3) to thereby obtain coordinate data y10 and y20 of origins of the Y1 scale and the Y2 scale when the beam 6 (the moving bodies 4 and 5) has reached a position detected by the origin sensors OS1 and OS2. Subsequently, a difference $\Delta y0$ (=y10−y20) between the coordinate data y10 and y20 is calculated by the controller 20 and stored into a storage unit 20-1 in the controller 20. This parameter $\Delta y0$ includes an installation error of the origin sensors OS1 and OS2. The installation error is an error component caused by the fact that a segment connecting between the origin sensors OS1 and OS2 is not always orthogonal to the guide rails 2 and 3. This means that geometric position data of the origin positions is obtained in this preparation operation.

1-b. Correction of Parameter $\Delta y0$

The orthogonality is measured by the use of the prototype square. A value to be added or subtracted with respect to $\Delta y0$ is derived according to the measured orthogonality, thereby correcting the value of parameter $\Delta y0$. Then, the corrected value is determined as a correction parameter $\Delta y1$. The correction parameter $\Delta y1$ is used as a reference value (target value) when adjusting the orthogonality at item (3) which will be described later. In this event, taking into account errors of the prototype square and the measurement accuracy, the orthogonality is set to fall within an accuracy range of [(errors of prototype square and measurement accuracy) ±0.2 degrees]. Herein, accuracy evaluation of the orthogonality is performed by an angle because the distance between the Y1 scale and the Y2 scale is constant. The parameter $\Delta y1$ will hereinafter be used as initial value data.

Subsequent operation is carried out in the state of actual use at an installation site of the stage device and yaw axis rotation control operation, which will be described hereinbelow, is executed by the controller 20. Therefore, a program for the yaw axis rotation control operation is prestored in the storage unit 20-1 of the controller 20.

(2) Data Acquisition in Mechanical Reset

When a mechanical reset (start) is performed after continuous operation of the stage device, control is temporarily implemented in the state where the orthogonality has changed due to heat generation or the like as shown in FIG. 5. In the same manner as described before, the Y1 linear motor and the Y2 linear motor are started to thereby obtain coordinate data y13 and y23 of origins of the Y1 scale and the Y2 scale when the beam 6 (the moving bodies 4 and 5) has reached a position detected by the origin sensors OS1 and OS2. Then, a difference $\Delta y3$ (=y13−y23) between the coordinate data y13 and y23 is calculated by the controller 20.

(3) Adjustment of Orthogonality by Yaw Axis Rotation Control

The reference value (target value) necessary for adjusting the orthogonality by the yaw axis rotation control is the foregoing correction parameter $\Delta y1$ determined at 1-b of item (1).

That is, referring to FIG. 6, since a difference ($\Delta y1-\Delta y3$) is an offset in a rotation direction (yaw axis rotation direction) from the state where the orthogonality is adequate, the beam 6 is rotated about the yaw axis by the value of the difference ($\Delta y1-\Delta y3$). Naturally, a rotating direction is a direction of correcting the offset of the orthogonality. In this embodiment, an allowable limit value of a rotation angle in the yaw axis rotation control is set to 11 seconds. This is a value such that a thrust necessary for rotating the beam 6 for 11 seconds is expected to be 10% of a rated thrust of the linear motor.

(4) Confirmation Operation

The foregoing process of (2) is carried out again to obtain a difference $\Delta y4$ of origins after a mechanical reset (start). Subsequently, it is confirmed that a value of an offset ($\Delta y1-\Delta y4$) of the difference $\Delta y4$ from the reference value (target value) is no greater than an allowable value (±0.5 seconds). That is, it is confirmed that ($\Delta y1-\Delta y4$)≦0±0.5 seconds. If this is confirmed, it means that the beam 6 has been adjusted to the orthogonality within a predetermined range. Note that $\Delta y4$=14−y24 where y14 and y24 are respectively coordinate data of origins of the Y1 scale and the Y2 scale when the beam 6 (the moving bodies 4 and 5) has reached a position detected by the origin sensors OS1 and OS2.

If the value of ($\Delta y1-\Delta y4$) exceeds the allowable value (±0.5 seconds), the foregoing processes of (3) and (4) are repeated.

Particularly, in this embodiment, when a power supply for driving the stage device is turned off, the beam 6 is automatically returned to a predetermined position (e.g. center portions of the guide rails 2 and 3). The predetermined position is a known value and, at the time of the foregoing mechanical reset, origin search operation is started where the beam 6 is returned to the position detected by the origin sensors OS1 and OS2. The beam 6 is moved at high speed to a position a predetermined distance short of the position that is detected by the origin sensors OS1 and OS2 and, then, is moved at slow speed until it reaches the position detected by the origin sensors OS1 and OS2. This increases the accuracy of reaching the origin sensors OS1 and OS2, thereby increasing the accuracy of coordinate data obtained from the Y1 scale and the Y2 scale.

Now, description will be made about the accuracy of orthogonality by comparing the case of using optical sensors as the origin sensors OS1 and OS2 and the case of using more accurate magnetic sensors as the origin sensors OS1 and OS2.

When the two origin sensors are provided, the accuracy of yaw origins, i.e. the accuracy of orthogonality of the beam 6, is determined by the measurement accuracy of the origin sensors and variation in relative position due to the fact that a segment connecting between the two origin sensors is not orthogonal to the guide members.

Figure 7:
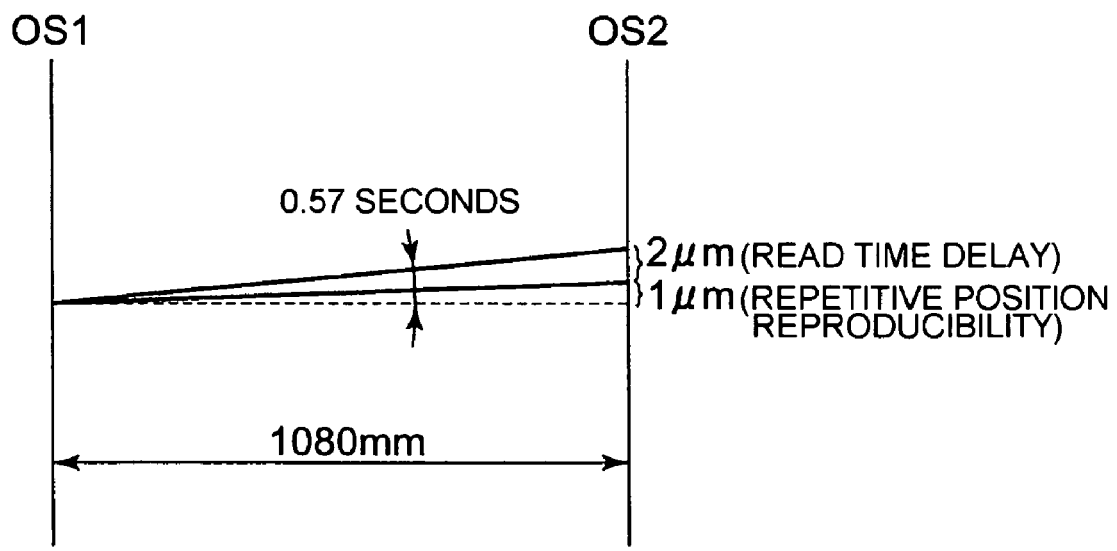
FIG. 7 is a diagram for explaining the accuracy of orthogonality when optical sensors are used as origin sensors for use in this invention.

Referring to FIG. 7, description will be made about the case where the optical sensors are used. It is given that repetitive position reproducibility of the optical sensor is ±1 µm and a displacement amount of the beam 6 due to read time delay by the linear scale after operation of the optical sensor is ±1 µm. In this case, the yaw origin accuracy has a variation of ±3 µm in total. Given that the extending length of the beam 6 is 1080 mm, the variation of ±3 µm is, when converted into an angle, $\tan^{-1}$(3 µm/1080 mm) which is about ±0.57 seconds. This value slightly exceeds the foregoing orthogonality of ±0.5 seconds within the predetermined range but is substantially satisfactory.

Figure 8:
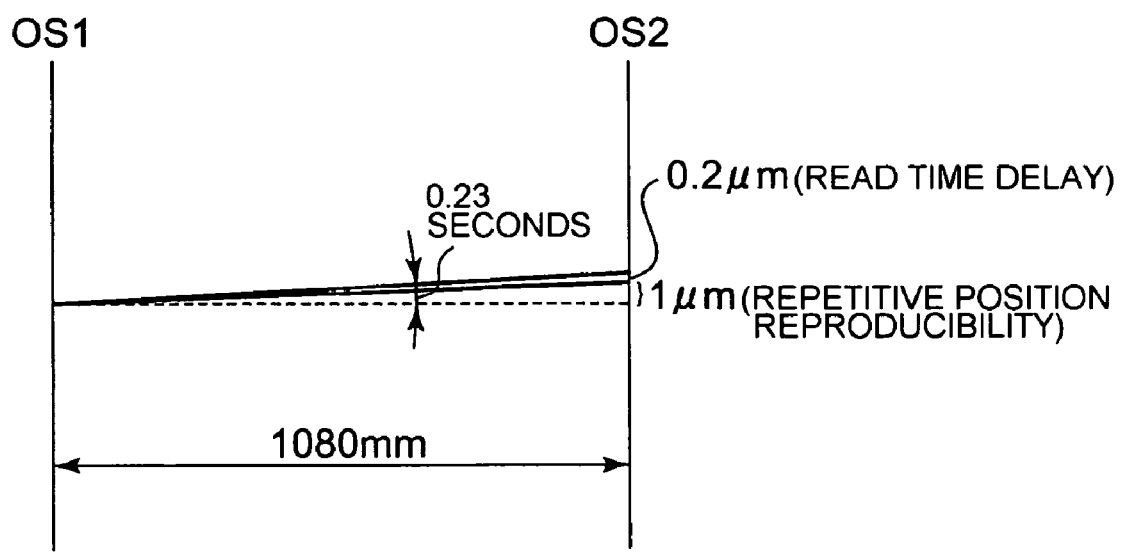
FIG. 8 is a diagram for explaining the accuracy of orthogonality when magnetic sensors are used as origin sensors for use in this invention.

Referring to FIG. 8, description will be made about the case where the magnetic sensors are used. It is given that repetitive position reproducibility of the magnetic sensor is ±0.1 µm and a displacement amount of the beam 6 due to read time delay by the linear scale after operation of the magnetic sensor is ±1 µm. In this case, the yaw origin accuracy has a variation of ±1.2 µm in total. Given that the extending length of the beam 6 is 1080 mm, the variation of ±1.2 µm is, when converted into an angle, $\tan^{-1}$(1.21 m/1080 mm) which is about ±0.23 seconds. This value is much smaller than the foregoing orthogonality of ±0.5 seconds within the predetermined range.

Now, description will be made about an influence that is exerted on the yaw origin accuracy when the temperature of the surface plate 1 changes. Speaking of the optical sensor, there is provided one that exhibits a detection position change of 20 μm when the temperature changes from 25° C. to 55° C., i.e. when the temperature rises by 30° C. In this case, the change is 0.67 μm/1° C. However, when the changes in temperature of the two optical sensors are equal to each other, the foregoing change can be ignored. If there is a difference of 1° C. between the changes in temperature of the two optical sensors, it becomes $\tan^{-1}(0.67 \text{ μm}/1080 \text{ mm})$ which is about ±0.12 seconds.

On the other hand, speaking of the magnetic sensor, there is provided one that exhibits 0.1 μm/1° C. with respect to temperature drift. If such a magnetic sensor is used, it becomes $\tan^{-1}(0.1 \text{ μm}/1080 \text{ mm})$ which is about ±0.02 seconds.

In FIGS. 2(a) and 2(b), the origin sensors OS1 and OS2 and the shielding members or the members to be detected SS1 and SS2 are disposed at positions slightly away from the inner sides of the guide members 2 and 3. However, these positions of disposition are preferably outside the guide members 2 and 3. This is because as the distance from the position of disposition of each of the shielding members or the members to be detected SS1 and SS2 to the tip of the beam 6 becomes larger, the resolution of the angle, in other words, the resolution about the deformation amount of the beam 6, increases.

While this invention has been described in terms of the preferred embodiment, this invention is not limited to the foregoing embodiment. In the stage device according to the foregoing embodiment, the two moving bodies 4 and 5 connected by the beam 6 are respectively guided by the two guide members 2 and 3 each extending in one axis direction and the other moving body 14 is installed on the beam 6. However, this invention is also applicable to a stage device having a structure with no other moving body 14, wherein two moving bodies connected by a beam are respectively guided by two guide members each extending in one axis direction. In this case, the table for placing thereon a member to be processed is combined with the beam 6. Further, this invention is also applicable to a stage device having a structure comprising two linear motors that respectively cause two moving bodies to be slidable in one axis direction on a surface plate, wherein only one of the two moving bodies is guided by a guide member extending in the one axis direction. Naturally, a beam is laid between the two moving bodies so as to be orthogonal to the guide member and movable along with the two moving bodies.

In the stage device according to this invention, even if the beam or the like is subjected to deformation due to the continuous operation, for example, the temperature rise, the orthogonality of the beam with respect to the guide member can be constantly maintained within the predetermined range. Accordingly, a member to be processed, which is placed on the table on the beam, can be positioned with high accuracy.

INDUSTRIAL APPLICABILITY

A stage device according to this invention is applicable to the whole range of stage devices wherein a table placed thereon with a member to be processed can be driven at least in the X-axis and Y-axis directions and, if circumstances require, further in the Z-axis direction.

The invention claimed is:

1. A stage device comprising a surface plate, two linear motors for respectively moving two moving bodies in one axis direction on said surface plate, a guide member for guiding at least one of said two moving bodies in said one axis direction, and a beam laid between said two moving bodies so as to be orthogonal to said guide member and to be moved along with said two moving bodies, said stage device characterized by comprising:
   two position sensors for respectively detecting positions of said two moving bodies,
   two origin sensors for respectively defining origin positions of said two moving bodies, and
   a controller for, responsive to detection signals from said two position sensors and said two origin sensors, controlling said two linear motors to thereby perform a position control of said two moving bodies,
   wherein said controller has a yaw axis rotation control function of individually controlling said two linear motors to thereby rotate said beam about a yaw rotation axis perpendicular to said one axis direction and, based on said yaw axis rotation control function, said controller performs, at the time of starting said stage device, a control of maintaining an orthogonality of said beam with respect to said guide member within a predetermined range even when the orthogonality of said beam with respect to said guide member changes.

2. A stage device according to claim 1, characterized in that said controller comprises a storage unit storing therein a yaw axis rotation control program for performing said yaw axis rotation control function, and
   said storage unit stores initial value data of said yaw axis rotation control program as a target value, wherein said target value is determined by said controller based on the orthogonality of said beam measured while said stage device is stopped, said target value being a correction value Δy1 necessary for causing the orthogonality of said beam to fall within said predetermined range.

3. A stage device according to claim 2, characterized in that said yaw axis rotation control program is for executing:
   a step of driving, at the time of starting said stage device, said two moving bodies to positions detected by said two origin sensors in the state where the orthogonality of said beam is changed and calculating a difference Δy3 between two coordinate data obtained by said two position sensors at that time instant, and
   a step of using said correction value Δy1 and said difference Δy3 and rotating said beam about said yaw rotation axis by (Δy1−Δy3).

4. A stage device according to claim 3, characterized in that said controller calculates a difference Δy0 between two coordinate data obtained by said two position sensors when said moving bodies are moved to positions detected by said two origin sensors in the state where said stage device is placed as it is and stores the calculated difference Δy0 into said storage unit and said controller further determines said correction value Δy1 based on said calculated difference Δy0.

5. A stage device according to any of claims 1 to 4, characterized in that optical sensors or magnetic sensors are used as said origin sensors.

6. A stage device according to claim 5, characterized by comprising two guide members extending in parallel to each other in said one axis direction for respectively guiding said two moving bodies in said one axis direction,
   wherein said beam has one end fixed to one of said two moving bodies and the other end joined to the other of said two moving bodies through a plate spring structure.

* * * * *